(12) United States Patent
Young et al.

(10) Patent No.: US 9,660,417 B2
(45) Date of Patent: May 23, 2017

(54) LIGHT EMITTING DEVICE WITH EXTENDED MODE-HOP-FREE SPECTRAL TUNING RANGES AND METHOD OF MANUFACTURE

(71) Applicant: Photodigm Inc., Richardson, TX (US)

(72) Inventors: Preston P. Young, Arlington, TX (US); Annie Xiang, Allen, TX (US)

(73) Assignee: Photodigm, Inc., Richardson, TX (US)

( * ) Notice: Subject to any disclaimer, the term of this patent is extended or adjusted under 35 U.S.C. 154(b) by 113 days.

(21) Appl. No.: 14/170,254

(22) Filed: Jan. 31, 2014

(65) Prior Publication Data
US 2015/0222088 A1    Aug. 6, 2015

(51) Int. Cl.
*H01S 5/125*    (2006.01)
*H01S 5/022*    (2006.01)
*H01S 5/024*    (2006.01)

(52) U.S. Cl.
CPC .......... *H01S 5/125* (2013.01); *H01S 5/02256* (2013.01); *H01L 2224/48091* (2013.01); *H01S 5/02212* (2013.01); *H01S 5/02469* (2013.01)

(58) Field of Classification Search
CPC .. H01S 5/024–5/02415; H01S 5/02438; H01S 5/02461–5/02492; H01S 5/125; H01S 5/0612; H01S 5/0622
See application file for complete search history.

(56) References Cited

U.S. PATENT DOCUMENTS

| | | | |
|---|---|---|---|
| 4,914,667 A * | 4/1990 | Blonder et al. ............ | 372/44.01 |
| 5,870,417 A * | 2/1999 | Verdiell ............. | G02B 6/12007 372/102 |
| 6,261,858 B1 * | 7/2001 | Kitaoka ............. | G02B 6/12004 438/25 |
| 6,839,376 B2 * | 1/2005 | Goto ............................ | 372/101 |
| 7,778,295 B2 * | 8/2010 | Matsui et al. .................. | 372/34 |
| 2011/0268143 A1 | 11/2011 | Strittmatter et al. | |
| 2013/0114628 A1 | 5/2013 | Caneau et al. | |

FOREIGN PATENT DOCUMENTS

| | | |
|---|---|---|
| EP | 1720225 A1 | 11/2006 |
| WO | 2007089042 A1 | 8/2007 |
| WO | 2013070827 A1 | 5/2013 |

OTHER PUBLICATIONS

Achtenhagen, M., et al., "Spectral Properties of High-Power Distributed Bragg Reflector Lasers," Journal of Lightwave Technology, Aug. 15, 2009, 3433-3437, vol. 27, No. 16, IEEE.
Hu, M., et al., "Longitudinal Mode Hops in High-power 1060-nm Semiconductor DBR Lasers," before 2010, 6 pages.
Li, J., et al., "Wavelength Tunable High-Power Single-Mode 1060-nm DBR Lasers," Proc. SPIE, Novel In-Plane Semiconductor Lasers XI, Jan. 21, 2012, 6 pages, vol. 8277, San Francisco, CA.

* cited by examiner

*Primary Examiner* — Jessica Manno
*Assistant Examiner* — Sean Hagan
(74) *Attorney, Agent, or Firm* — Slater Matsil, LLP (57) ABSTRACT

Laser with extended mode-hop free spectral tuning ranges and methods of manufacture such lasers are disclosed. In one embodiment an electrical device includes a carrier and a light emitting device including an active region and a first passive region disposed on a first side of the active region, wherein the active region of the light emitting device is disposed on the carrier while the first passive region is thermally floating.

22 Claims, 12 Drawing Sheets

LIGHT EMITTING DEVICE WITH EXTENDED MODE-HOP-FREE SPECTRAL TUNING RANGES AND METHOD OF MANUFACTURE

TECHNICAL FIELD

The present invention relates generally to light emitting devices such as lasers and in particular embodiments to Distributed Bragg reflector (DBR) laser diodes.

BACKGROUND

A laser is an optical source that emits photons in a coherent beam. Laser light is typically a single wavelength or color, [and may be emitted in a narrow beam]. A semiconductor laser diode is a laser diode in which the active medium is a semiconductor. A common type of semiconductor laser is formed from a p-n junction, a region where p-type and n-type semiconductors meet, and powered by injected electrical current. The color or frequency of the emitted light may depend on the gain medium.

As in other lasers, the gain region of the semiconductor laser may surrounded by an optical cavity. An optical cavity (or optical resonator) is an arrangement of mirrors, or reflectors that form a standing wave reflector for light waves. In particular, DBR laser diodes comprise a periodic grating for selecting the wavelength for at least one of the mirrors and provide the feedback, reflecting light back into the cavity to form the resonator.

SUMMARY OF THE INVENTION

In accordance with an embodiment of the present invention, an electric device comprises a carrier, and a light emitting device comprising an active region and a first passive region disposed on a first side of the active region, wherein the active region of the light emitting device is disposed on the carrier while the first passive region is thermally floating.

In accordance with another embodiment of the present invention an electric device comprises a laser diode having an active region and a passive region, the passive region monolithically attached to a side of the active region, wherein the laser diode is configured to emit mode hop free light for a drive current range of about 50 mA.

In accordance with another embodiment of the present invention an electric device comprises an active region configured to emit light and a wavelength selection region disposed adjacent to the active region, wherein the wavelength selection region is configured to maintain the same temperature as the active region during current excursions.

In accordance with another embodiment of the present invention an electric device comprises an active region configured to emit light and a wavelength selection region disposed adjacent to the active region, wherein the wavelength selection region is configured to track the peak gain of the active region passively.

In accordance with another embodiment of the present invention an electrical device comprises an active region configured to emit light and a wavelength selection region disposed adjacent to the active region, wherein the wavelength selection region is configured to change a reflectivity at the same rate as a thermally induced change in a wavelength of the active region.

In accordance with yet another embodiment of the present invention a method for manufacturing an electric device comprises providing a light emitting device, the light emitting device comprising a gain region and a wavelength selection region and mounting the light emitting device on a carrier such that the gain region is disposed on a first carrier surface and the wavelength selection region is disposed over a second carrier surface, the first carrier surface being spaced apart from the second carrier surface.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Spectral mode hopping is a phenomenon which is mostly discussed in the context of single frequency laser diodes. Under some external influences, such laser diodes may operate on a single resonator mode for some time, but then suddenly switch to some other mode which dominates the optical power. For a short while, however, there may be power in both modes.

Spectral mode hops are often provoked by external influences. For example, a DBR laser diode may contain a resonator or grating region (e.g., corrugated waveguide structure) providing wavelength-dependent feedback to define the emission wavelength. The spectral reflectivity of the DBR grating region of the DBR laser diode can be determined by a temperature of the DBR grating region which may affect the effective grating period and the refractive index.

Figure 1A:
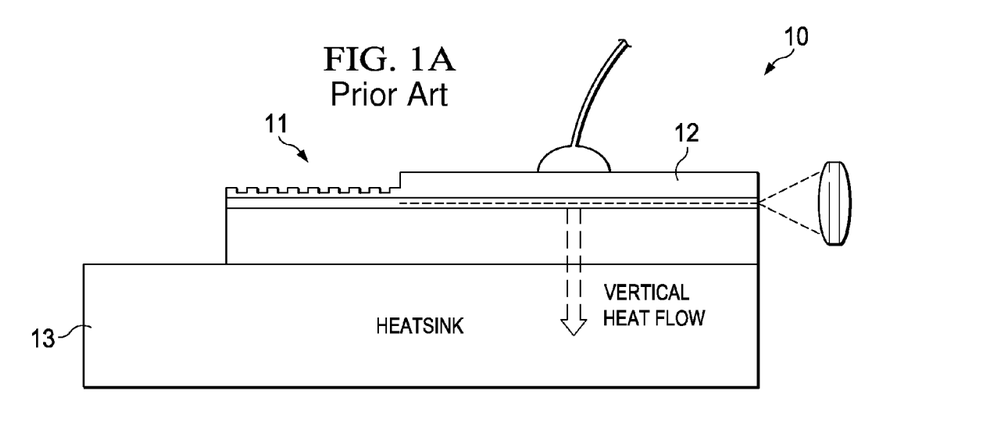
FIG. 1A shows a conventional mounted DBR laser diode.
Figure 1B:
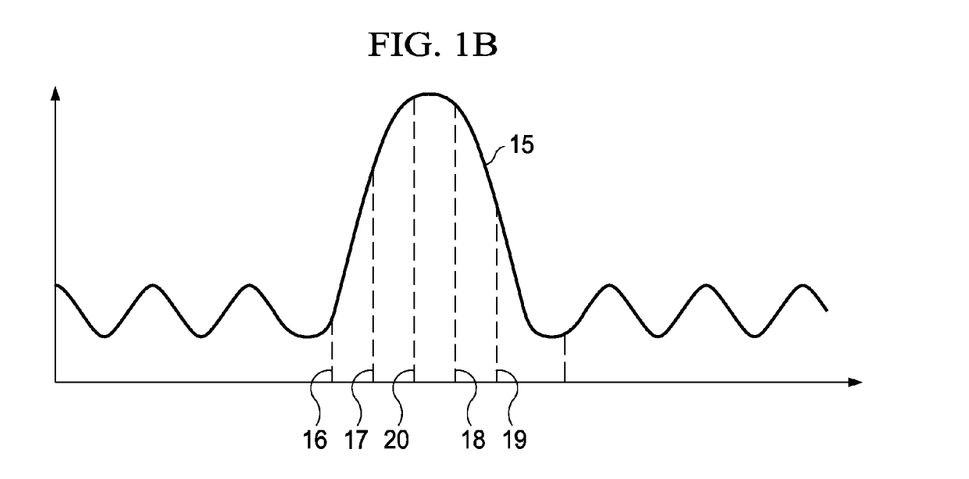
FIG. 1B shows a spectral reflectivity curve.
Figure 1C:
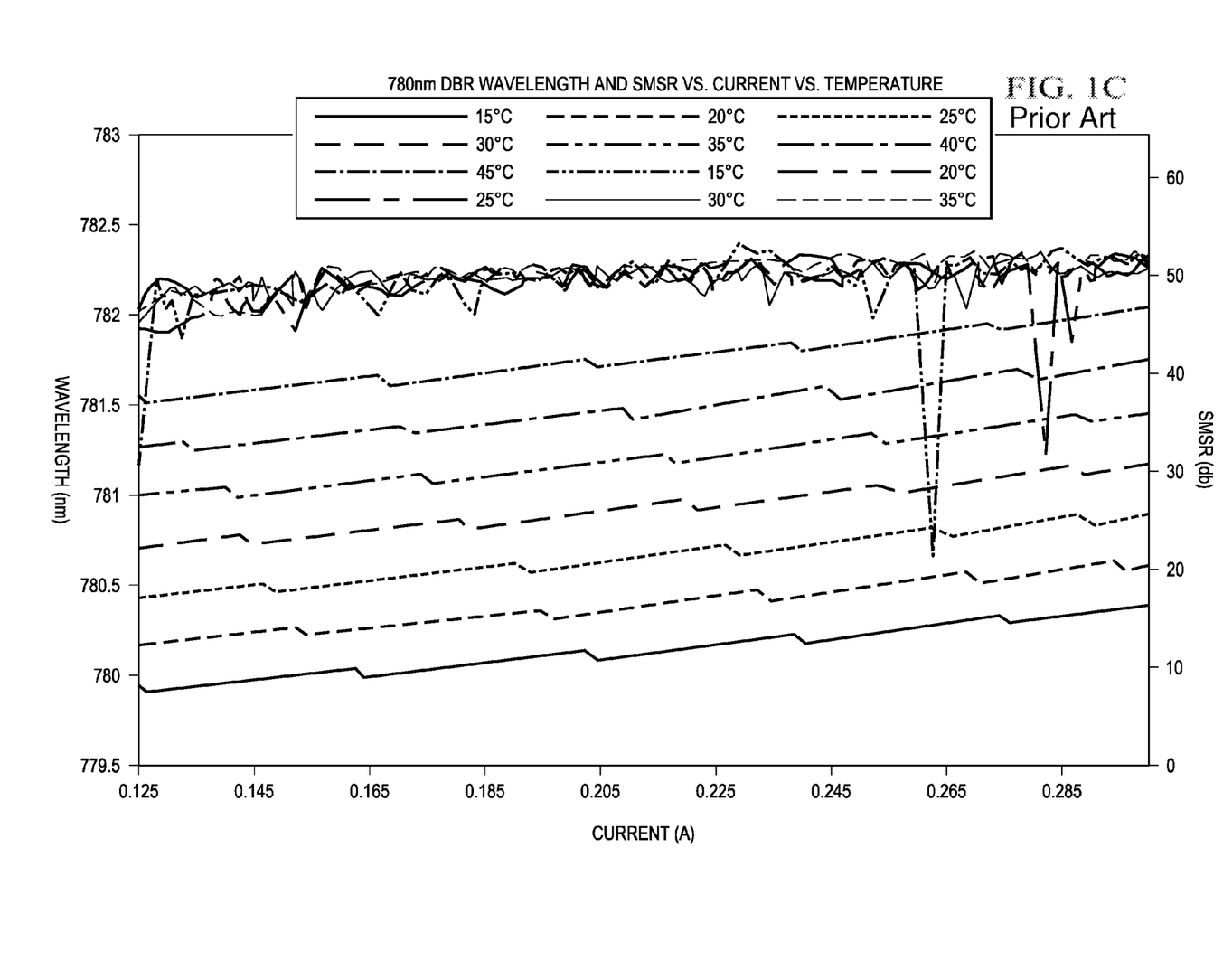
FIG. 1C shows a spectral characteristic of a conventional DBR laser diode.

FIG. 1A shows a conventional mounted DBR laser diode 10 having both the gain region 11 and the DBR grating region (or section) 12 bonded to the mounting surface of a carrier 13 (e.g., a heatsink). The mounting surface serves both as an electrical connector for a terminal of the DBR laser diode 12 and as a thermal connector for a thermal path to the heatsink 13. FIG. 1B shows a spectral reflectivity curve 15 of such a DBR laser diode. The spectral reflectivity curve 15 comprises allowed spectral modes 16-19 and a lasing mode 20. A mode hop occurs when amplitude of gain for an allowed spectral mode 16-19 is greater than the current lasing mode 20. The lasing mode jumps from the current lasing mode 20 to a shorter allowed spectral mode (wavelength) 17 when the temperature is increased and jumps from the current lasing mode 20 to a longer allowed spectral mode 18 when the temperature is decreased. When an electrical current is injected through the DBR laser diode 10 in order to produce laser light, heat is generated in the gain region 12 of the DBR laser diode 10. For example, the heat based on the electrical current causes the peak wavelength of the DBR laser diode 10 to increase approximately by 3 nm/amp. FIG. 1C shows curves of a conventional DBR laser diode 10 for different drive currents and different temperatures for a 780 nm DBR laser diode. The wavelength curves may make significant jumps with only small changes in between these jumps when the current (and therefore the heat) in the gain section 12 of the DBR laser diode 10 is increased from 125 mA to 300 mA. The wavelength curves of a conventional DBR laser diode 10 may reflect sawtooth curves when the drive current is increased/decreased. The wavelength curves exhibit sudden jumps of optical frequency (spectral mode hops) when the current is increased/decreased causing another allowed laser resonator cavity mode to experience higher gain (or lower losses) relative to the current lasing mode. For example, the gain peak typically shifts to longer wavelengths at ~0.3 nm/C, and the lasing wavelength for a DBR changes at ~0.05 nm/C. Depending on the temperature and drive current the wavelength may decrease instead of increase.

Spectral mode hops may not be desired for certain applications. For example, spectral mode hops may be disturbing, because they may make it difficult to obtain continuous wavelength tuning.

Embodiments of the invention may provide suppression of spectral mode hops of a light emitting device such as a semiconductor laser (e.g., a laser diode). Other embodiments of the invention may provide a laser diode comprising a gain region and a wavelength selection or resonator region (e.g., the DBR grating region), wherein only the gain region is bonded to a carrier, while the wavelength selection region is thermally floating. In other words, the wavelength selection region may not comprise a direct thermal path to the carrier. The wavelength selection region which may be disposed laterally adjacent the gain region may become isothermal with the gain region. In yet other embodiments the gain region and the wavelength selection region are configured to maintain the same temperature even when the drive current is changed. In other words, the gain region and the wavelength selection region do not experience different temperatures to each other when the drive current is increased or reduced.

In some embodiments the DBR spectral reflectivity and lasing wavelength is determined by the temperature of the gain region which may be a function of both the injection current and the heatsink temperature. In other embodiments the wavelength selection region (or wavelength dependent feedback element) changes reflectivity at the same rate as the thermally induced change in wavelength of the gain region. The peak reflectivity of the wavelength selection region (feedback element) tracks the peak gain of the gain (active) region passively because the feedback element is thermally floating. The wavelength selection region may react to the heat change in the gain region within less than 15 milliseconds (ms) or less than 10 ms. Alternatively, the wavelength selection region may react to the heat change in the gain region between 8 ms and 12 ms or 10 ms and 15 ms.

In contrast, if the feedback element is thermally sunk to the carrier, its temperature is maintained reasonable constant (e.g., to the temperature of the carrier) while the gain region heats up thereby causing the mode to jump to a higher reflectivity point of the feedback element's spectral characteristic.

Such an arrangement is advantageous because the DBR grating region is allowed to follow or track temperature changes in the gain region fast due to either or both heating from the injection current or changes in the diode substrate temperature (e.g., from the heat sink) Therefore, the DBR spectral characteristic is able to shift according to the temperature of the body of the diode and not according to the temperature of the carrier or heatsink.

In some embodiments the gain region is connected to a first carrier surface and a wavelength selection region is spaced apart from a second carrier surface. In yet other embodiments the gain region is disposed on a first surface of a carrier and a wavelength selection region is disposed over and spaced apart from a second surface such as a trench bottom surface.

Figure 1D:
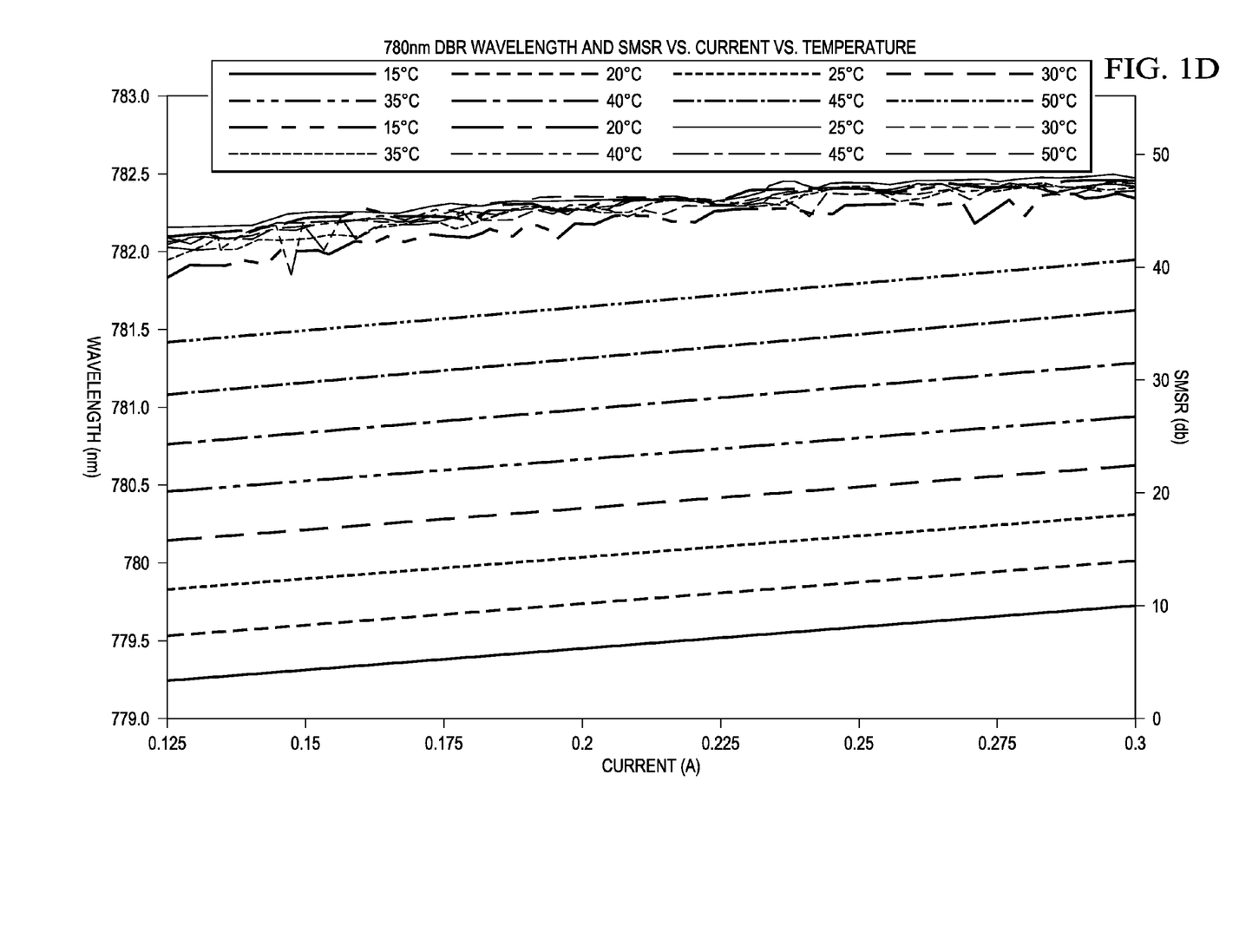
FIG. 1D shows a spectral characteristic of a DBR laser diode according to an embodiment of the invention.

Such an arrangement is advantageous because the heat from the gain region of the laser diode transfers to the wavelength selection region (e.g., DBR grating region) through the body of the laser diode (e.g., gain region) allowing the temperature of the wavelength selection region to follow (or adjust to) that of the gain region. The wavelength selection region is not fixed to the heat sink temperature allowing the temperature of the wavelength selection region to thermally float. The spectral wavelength may therefore shift with changes in the temperature resulting from the gain region injection (or drive) current. This allows the peak reflectivity wavelength of the wavelength selection region to follow the wavelength of the lasing mode with increasing/decreasing temperature. A wide mode hop free spectral tuning range as shown in FIG. 1D is achievable. Such an arrangement prevents advantageously the DBR laser diode from experiencing spectral mode hops for that range.

Figure 2A:
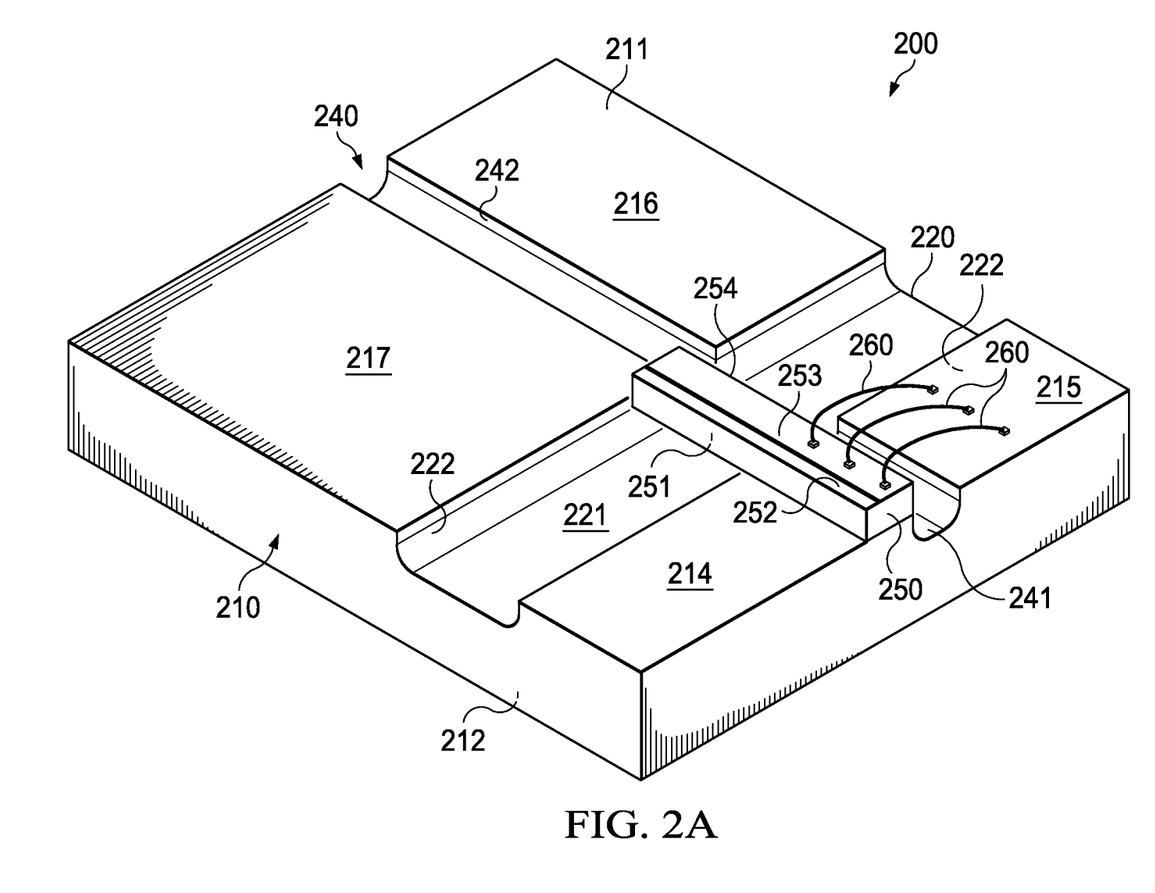
FIG. 2A shows an embodiment of a laser diode disposed on a carrier.

The embodiment of FIG. 2A shows a module 200 comprising a light emitting device (e.g., a laser diode) 250 disposed on a carrier 210. The carrier 210 may be a substrate such as a ceramic. The substrate may comprise a material that has a similar thermal coefficient of extension (TCE) as the substrate of the laser diode. For example, the carrier substrate may comprise aluminum nitride (AlN), gallium nitride (GaN), sapphire, diamond, or beryllium oxide (BeO). Alternatively, the carrier substrate may comprise copper tungsten (CuW) in a combination of 20%:80% or 15%:85%. In another embodiment the carrier substrate may comprise a material that has a similar TCE as the indium phosphide (InP) substrate of the laser diode.

Figure 2B:
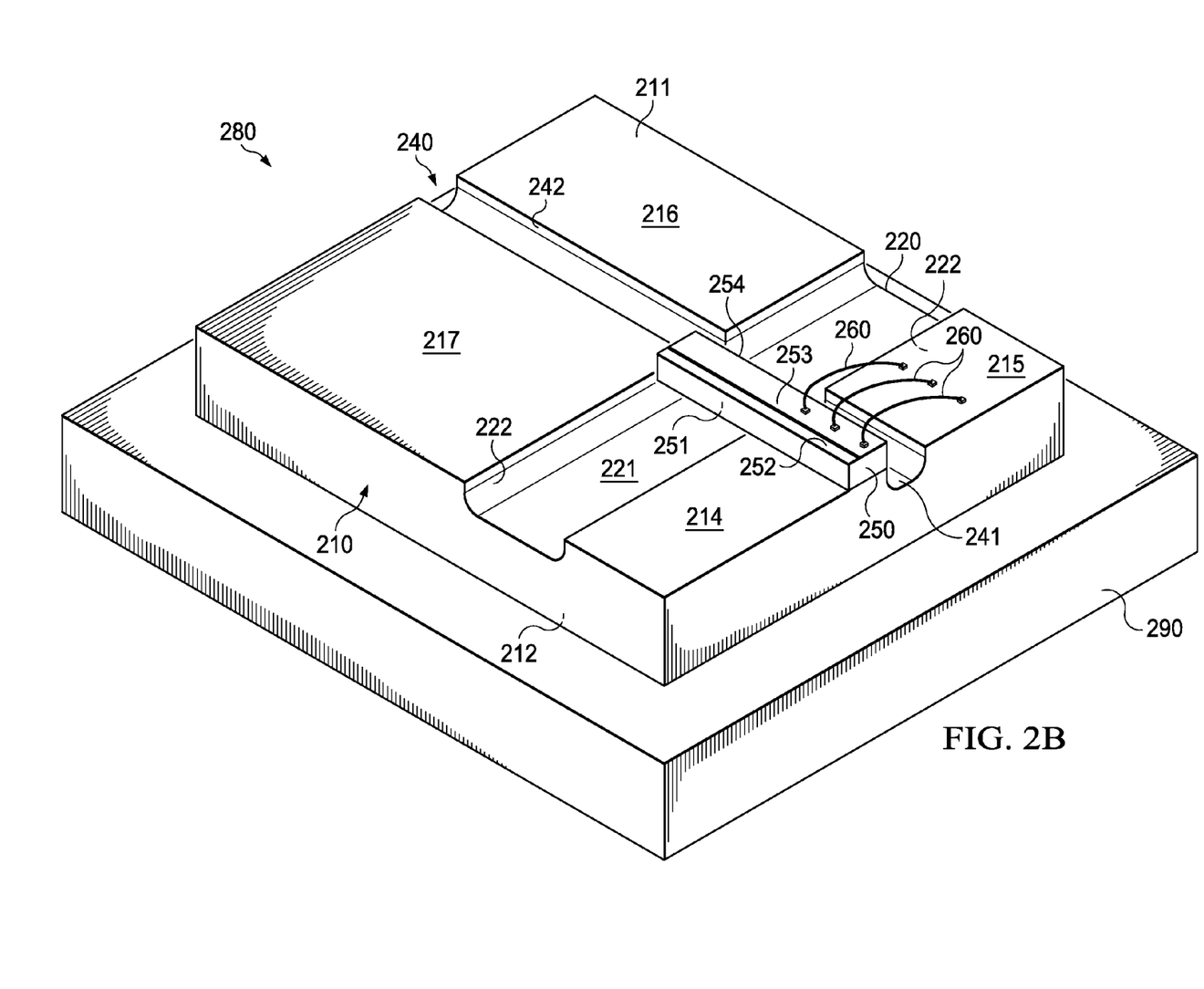
FIG. 2B shows an embodiment of a laser diode disposed on a submount and the submount disposed on a heatsink.

The carrier 210 may be a submount disposed between the light emitting device 250 and a heatsink (FIG. 2B). The carrier 210 is thermally conductive but electrically isolating. Alternatively, the carrier 210 is thermally and electrically conductive. The carrier 210 comprises a top surface 211 and a bottom surface 212. The carrier 210 may comprise a top view size of 3 mm-5 mm×3 mm-5 mm. Alternatively, the carrier 210 may comprise a size of about 4 mm×4 mm. The carrier 210 may have a similar coefficient of thermal expansion (CTE) as the light emitting device 250. In one example, the CTE of the substrate material of the carrier 210 is similar to a CTE of a semiconductor material of the light emitting device 250 such as GaAs. Particularly, the light emitting device 250 may have a CTE of 6.8 and the substrate material of the carrier 210 may have a CTE of 6.8. Alternatively, the light emitting device 250 material and the carrier 210 material may have different CTEs.

In another embodiment, the carrier 210 is a heatsink, e.g., thermally and electrically conductive. The carrier 210 may comprise a metal such as copper or tungsten, or a copper alloy or tungsten alloy. Alternatively, the carrier 210 comprises other metallic materials.

The carrier 210 comprises a first trench, groove or recess 220. The first trench 220 comprises a first bottom surface 221 and first sidewalls 222. The carrier 220 further comprises a second trench, groove or recess 240. The second trench 240 comprises a second bottom surface 241 and second sidewalls 242. A conductive layer may be disposed on the top surface 211 of the carrier 210. The conductive layer may comprise a metal or metal alloy. For example, the conductive layer comprises copper. Alternatively, the conductive layer comprises a precious material such as gold, silver, gold alloy or silver alloy. In some embodiments the conductive layer comprises a layer stack comprising different conductive materials. The first and second trenches 220 and 240 separate the top surface of the carrier 200 into four sections 214-217.

Figure 3A:
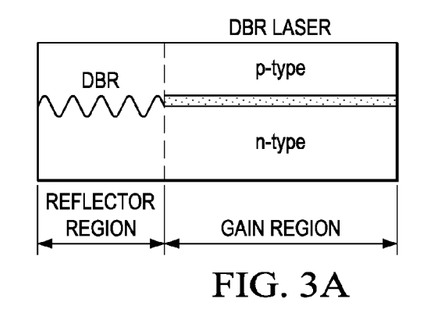
FIG. 3A shows a single sided DBR laser diode.

The light emitting device 250 may comprise a laser diode. For example, the laser 250 may be a DBR laser diode. The DBR laser diode 250 comprises an active region or gain region 252 and a resonator region (or wavelength selection region) 254 such as a DBR grating region (FIG. 3A). The active region is configured to generate electromagnetic radiation. For example, the laser diode 250 may emit light in the near infrared range (750 nm-1400 nm), the red range (615 nm-740 nm), the green range (520 nm-570 nm) or the blue range (360 nm-480 nm). The laser diode may be a single frequency laser. The laser-frequency may be light of 360 nm, 780 nm, 795 nm, 852 nm, 1064 nm, or 1083 nm. Alternatively, the laser may emit other light, e.g., light of 1550 nm.

In one embodiment the bottom surface 251 of the laser diode 250 is mounted, e.g., soldered or adhered to the first section 214 of the carrier 210. The bottom surface 251 (or the contact on the bottom surface) of the laser diode 250 may comprise the cathode. The bottom surface 251 may be electrically connected to the first section 214. The top surface (or contact(s) on the top surface) 253 of the laser diode 250 is electrically connected to the second section 215 of the carrier 210. For example, the contacts on the top surface 253 are wire bonded via e.g. three bond wires 260 to the second section 215. Alternatively, the contact(s) on the top surface 253 are clip bonded to the second section 215. The top surface 253 of the laser diode 250 may comprise the anode. Third and fourth sections 216, 217 may be used to add and bond ancillary components such as thermistors or photodiodes.

The DBR gain region 252 is disposed on a first surface 211 of the carrier 210 and the DBR grating region 254 is disposed over and spaced apart from a second surface, e.g., lower surface. In FIG. 2A, the DBR gain region 252 is disposed on the first section 214 and the DBR grating region 254 is disposed over and spaced apart from the first bottom surface 221 of the first trench 220. The DBR grating region 254 is disposed over the first trench 220 without being thermally or electrically connected to the first trench 220. The bottom surface of the DBR grating region 254 is spaced apart from the bottom surface 221 of the trench and therefore is not mounted (e.g., soldered) to the first trench bottom surface 221 or the first sidewalls 222 of the first trench 220.

The DBR grating region 254 may hang over the first trench 220. The DBR grating region 254 may be thermally floating. The DBR grating region 254 may only be thermally connected to the substrate of the carrier 210 through the gain region 252 of the laser diode 250. Alternatively, the DBR grating region 254 may be connected to the bottom surface 221 of the first trench 220 via an encapsulation material (e.g., molding material). The encapsulation material may be thermally isolating or at least thermally less conductive than the substrate material of the carrier 210. Alternatively, a thermal isolation material (different than the encapsulation material) such as a dielectric material may be disposed between the DBR grating region 254 and the first trench bottom surface 221 (e.g., underneath the DBR grating region 254). The DBR grating region 254 may not be soldered or otherwise adhered on to the fourth section 217. In some embodiments the entire DBR grating region 254 is disposed over the trench 220 and the entire gain region 252 is disposed on the first section 214. In other embodiments, the DBR grating region may be a passive resonator region which may not be separately heated or cooled by a current or a separate heating element disposed on the resonator region, for example.

The embodiment of FIG. 2B shows a module 280 comprising a first carrier 210 such as a submount disposed on a second carrier such as a (metal) heatsink 290, and a laser diode 250 disposed on the first carrier 210. The submount may have a CTE between the CTE of the laser diode 250 and the CTE of the (metal) heatsink 290. The elements of FIG. 2B have been described with respect to the embodiment of FIG. 2A. In some embodiments the carrier 210 of the embodiments of FIGS. 2A and 2B may not comprise the third and fourth sections 216, 217.

Returning to FIG. 1A, in normal operation of the laser diode, the extraordinary high current density in the active region causes a large temperature gradient between the active or gain region and the passive or wavelength selection region (e.g., DBR grating region) when both are thermally heat sunk. This may lead to the spectral mode hops. By thermally floating the wavelength selection region, the temperature gradient between the two regions may be mitigated or eliminated. The emitted light may have the characteristics as shown in FIG. 1D.

Moreover, as can be seen from FIG. 1D, the emitted light is mode hop free for a drive current range of 200 mA for a 780 nm DBR laser diode (and therefore also for drive current ranges of 50 mA, 100 mA or 150 mA). In some embodiments the emitted light may be mode hop free for a drive current range of 500 mA or even 700 mA. For example, a DBR laser diode emitting 795 nm light may be mode hop free for a drive current range of 200 mA, a DBR laser diode emitting 852 nm light may be mode hop free for a drive current range of 500 mA and DBR laser diodes emitting 976 nm, 1064 nm, 1083 nm or 1550 nm light may be mode hop free for a drive current range of 700 mA. In other embodiments the emitted light may be mode hop free for a drive current range of 50 mA. For example, a DBR laser diode emitting a specific wavelength in the blue light range (e.g., 360 nm), or green light range, or even UV light range may be mode hop free for a drive current range of 50 mA.

Figure 3B:
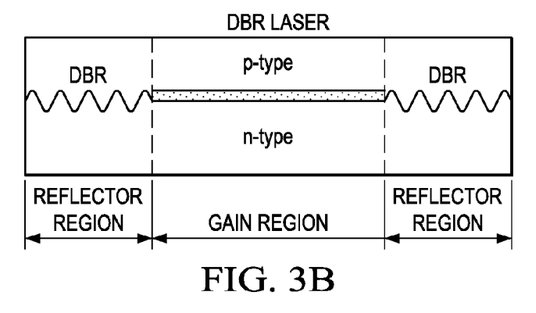
FIG. 3B shows a double sided DBR laser diode.

FIG. 3A shows a single sided distributed Bragg reflector (DBR) laser diode and FIG. 3B shows a double sided DBR laser diode. A DBR laser diode is a laser diode, where the laser resonator is made with at least one distributed Bragg reflector (DBR) outside the gain region. A DBR is a Bragg mirror, a light-reflecting device based on Bragg reflection at a periodic structure.

In some embodiments the DBR laser diode may contain some corrugated waveguide structure (a grating section) providing wavelength-dependent feedback to define the emission wavelength in the reflection region (wavelength selection region or feedback element) at one side of the amplifying, active or gain medium of the gain region. In other embodiments the other end of the gain region may have another DBR. The spectral reflectivity and lasing wavelength of the wavelength selection region may be determined by the temperature of the gain region which may be a function of both the injection current and the heatsink temperature. The spectral reflectivity of the wavelength selection region (e.g., DBR grating) may be determined by physical parameters such as the grating period, grating depth, grating duty cycle, and refractive index of the materials used. The spectral reflectivity may further be determined by the actual temperature of the DBR grating which affects the effective grating period and the refractive index.

The wavelength selection region may comprise only a DBR mirror. Alternatively, the wavelength selection region may comprise the complete layer cavity with two mirrors. The wavelength selection region may or may not comprise additional passive elements such as a passive space. In some embodiments at least one of the mirrors has a wavelength dependent spectral reflectivity characteristic.

In some embodiments the wavelength selection region changes reflectivity at the same rate as the thermally induced change in wavelength of the gain region. The peak reflectivity of the wavelength selection region may track the peak gain of the gain region passively because the wavelength selection region is thermally floating. In contrast, if the wavelength selection region is thermally sunk to the carrier, its temperature is maintained reasonably constant (e.g., to the temperature of the carrier) while the gain region heats up (e.g., through the drive current) thereby causing the mode to jump to a different (e.g., higher) reflectivity point of the wavelength selection region's spectral characteristic.

In some embodiments the DBR laser diode is a single-frequency laser. The DBR laser diode may be tunable. In some embodiments the DBR section of the DBR laser diode is a passive electrical element. Accordingly, in these embodiments there is no current injection directly into the DBR section of the laser diode. In other embodiments, there is no separate or individual heating of the DBR section of the laser diode. In alternative embodiments tuning within the free spectral range of the laser resonator may be accomplished with a separate phase section, which can e.g. be electrically heated.

The laser diode may be an edge emitting semiconductor laser (in-plane laser) or a grating coupled surface emitting laser (GSE).

Figure 4:
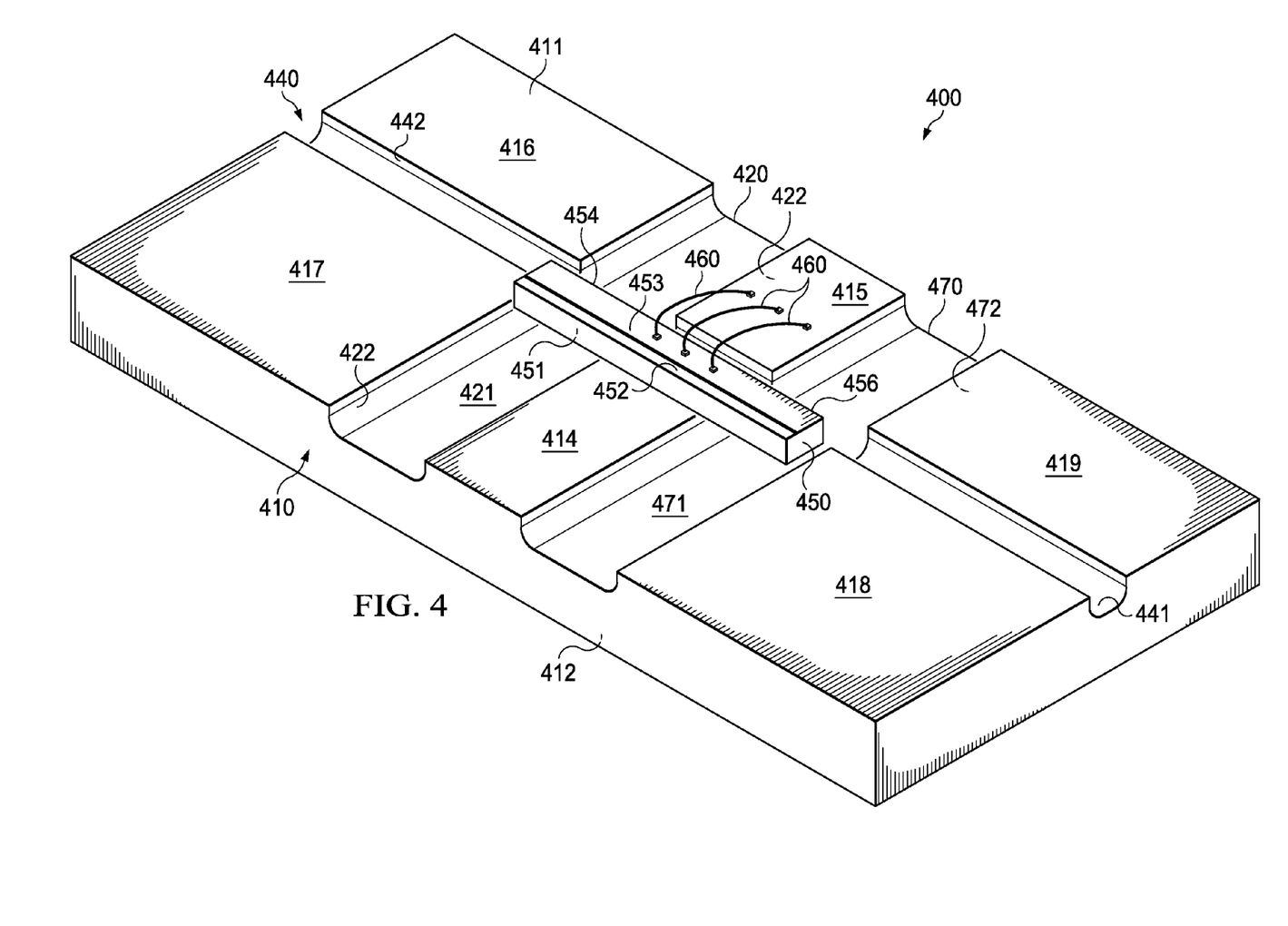
FIG. 4 shows an embodiment of a laser diode on a carrier.

FIG. 4 shows an embodiment of a module 400 comprising a laser diode 450 with a gain region 452 and two DBR grating regions 454, 456. Elements in the embodiment of FIG. 4 with similar numerical numbers as elements in the embodiment of FIG. 2A are the same. The embodiment of FIG. 4 differs from the embodiment of FIG. 2A because FIG. 4 comprises a third trench, groove or recess 470. The third trench 470 comprises a third trench bottom surface 471 and third trench sidewalls 472. The DBR grating region 456 is disposed over the third trench 470 and spaced apart from the bottom surface 471 of the third trench 470. The DBR grating region 456 may not be thermally or electrically connected to the third trench bottom surface 471 or the third trench sidewalls 472. The DBR grating region 456 may not be connected (e.g. soldered) to the third trench bottom surface 471 or the third sidewalls 472. The DBR grating region 456 may hang over the third trench 470. The DBR grating region 456 may only be thermally connected to the substrate of the carrier 410 through the gain region 452 of the laser diode 450. If the carrier 410 and the laser diode 450 are encapsulated with an encapsulation material, the encapsulation material may flow in the first and third trenches 420, 470 filling the space between the bottom surface 451 of the laser diode 450 and the trench bottom surfaces 421, 471. The encapsulation material may thermally insulate the DBR grating regions 454, 456 from the carrier substrate 410. Alternatively, a thermal isolation material (different than the encapsulation material) may be disposed in the first and third trenches 430, 470 underneath the laser DBR grating regions 454, 456 and on the first and third trench bottom surfaces 421, 471. In some embodiments the second trench 440 may be omitted. In such an embodiment the contact(s) of the top surface 453 of the laser diode 450 may be electrically connected via wires and clips 460 to the sector 416/417, for example. In other embodiments, the carrier 410 may not comprise third to sixth sections 416-419.

Figure 5A:
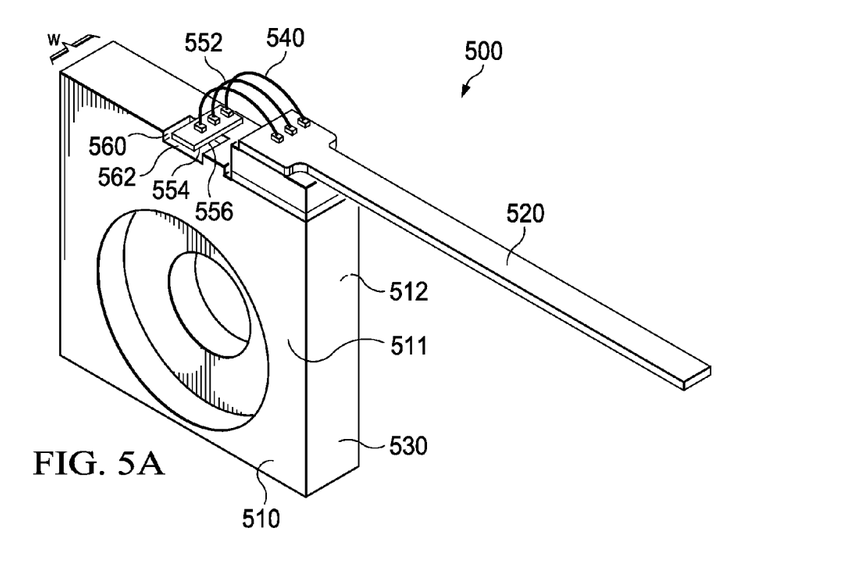
FIGS. 5A-5C show an embodiment of a laser diode on a C-mount.
Figure 5B:
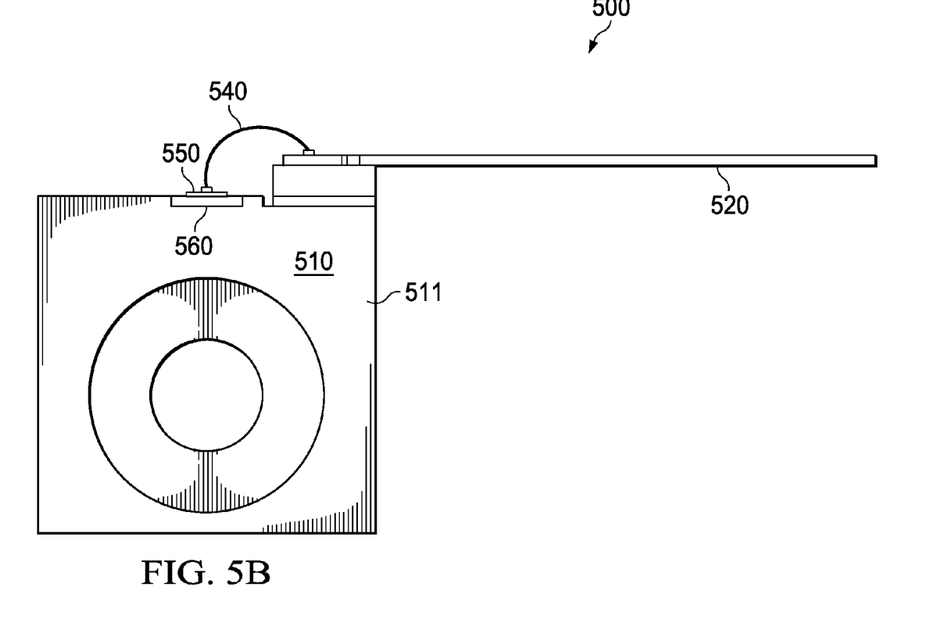
Figure 5C:
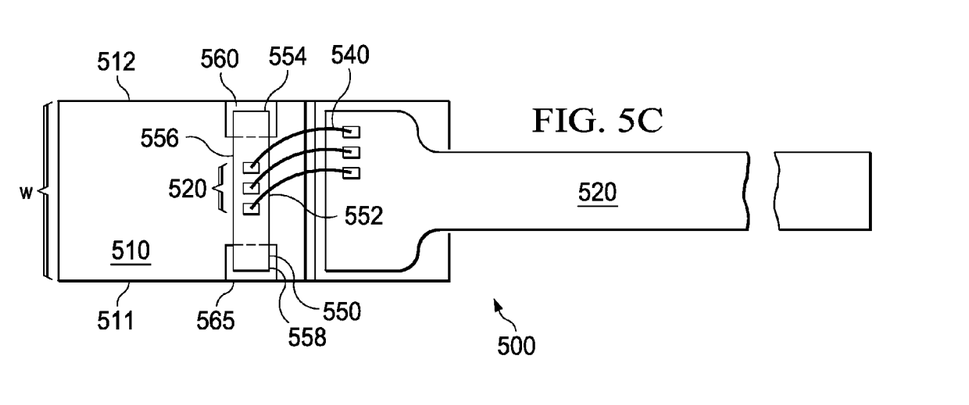

FIGS. 5A-5C show a module 500 according to an embodiment of the invention. A laser diode 550 and a first contact 520 (e.g., anode) are disposed on a carrier (e.g., mount) 510. The carrier 510 comprises a second contact 530 (e.g., cathode). A chip first contact or chip first contacts (top surface) 552 of the laser diode 550 are electrically connected to the first contact 520 via wires 540. Alternatively, the first chip contact(s) 552 of the laser diode 550 are connected to the anode contact 520 via conductive clips. The carrier 510 comprises a trench 560 such that the wavelength selection region or resonator 554 (e.g., DBR grating region) is thermally floating and only the gain region 556 of the laser diode 550 is mounted on the carrier 510. The resonator region 554 is spaced apart from a bottom surface of the trench 562. In some embodiments the laser diode 550 comprises one wavelength selection region 554 and the trench is associated with the wavelength selection region 554. In alternative embodiments the laser diode 550 comprises two wavelength selection regions 554, 558 and two trenches 560, 565 are associated with these two wavelength selection regions 554, 558, respectively. For example, the wavelength selection regions are disposed on opposite sides of the gain region 556 and the trenches 560, 565 are disposed on opposite sides 511, 512 of the carrier 510. In yet other embodiments, the laser diode 550 is longer than the width w of the carrier 510 (e.g., mount) so that the (two) wavelength selection region(s) 554 extend beyond the sidewalls or main surfaces 511, 512 of the carrier 510. A more detailed description of the laser diode 550 and the carrier 510 may be found in previous embodiments. FIG. 5A shows an embodiment of the module with a single trench 560 configuration and FIG. 5B shows an embodiment of the module with a double trench configuration. In alternative embodiments submount is disposed between the carrier 510 and the laser diode 550. In such embodiments the submount includes the trench(es) 560, 565 and the carrier 510 does not. The chip second contact or chip second contacts of the laser diode 550 may be electrically connected through the submount or via wires to the second contact 530.

Figure 6A:
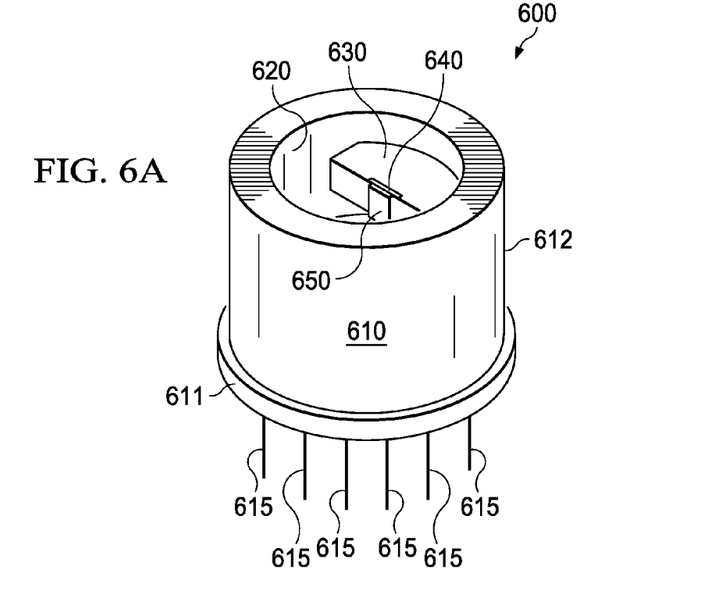
FIGS. 6A and 6B show an embodiment of a laser diode in a TO-8 package.
Figure 6B:
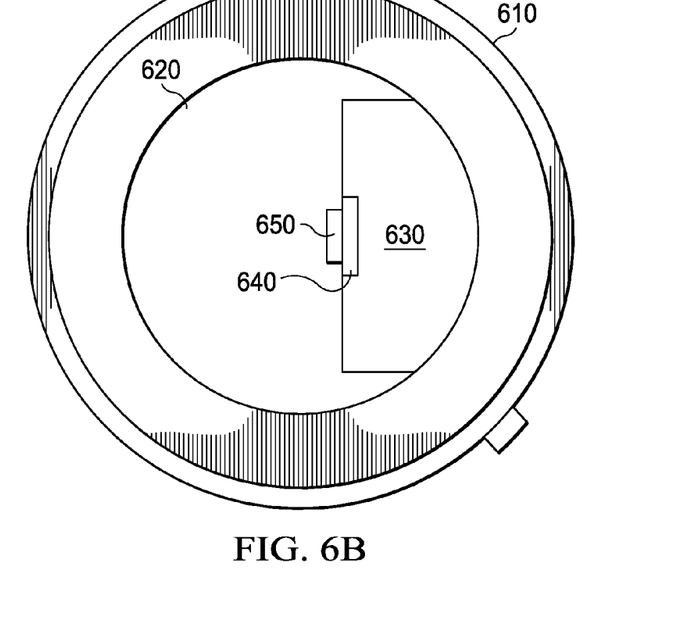

FIGS. 6A and 6B show a package 600 according to an embodiment of the invention. A laser diode 650 is disposed in an encapsulation body 610. The encapsulation body 610 comprises a plurality of pins 615 on a bottom surface 611 and a cavity or opening 620 on the top surface 612. The laser diode disposed on the carrier 630 is located in encapsulation body 610 such that the laser beam leaves the package 600 through the opening 620. The mount 630 may comprise a first surface on which the gain region of the laser diode 650 is mounted and a second surface, spaced from the first surface, over which the wavelength selection region or resonator region (e.g., DBR grating region) of the laser diode 650 is disposed (e.g., thermally floating). For example, the gain region of the laser diode 650 is mounted on the surface of the mount 630 and the wavelength selection region of the laser diode 650 is disposed over and spaced apart from a trench bottom surface of a trench 640. In some embodiments the laser diode 650 comprises one wavelength selection region and a trench is disposed under the wavelength selection region. In alternative embodiments the laser diode 650 comprises two wavelength selection regions and two trenches are disposed underneath these two wavelength selection regions respectively. In yet another embodiment, the laser diode 650 is longer than the width of the mount 630 so that the (two) wavelength selection region(s) may extend beyond a sidewall(s) of the mount 630. The laser diode 650 may be a DBR laser and the mount 630 may be the carrier as described in the embodiments of FIGS. 2A, 2B and 4, and their related description. A more detailed description of the laser diode 650 and the carrier 630 may be found in previous embodiments.

Figure 7:
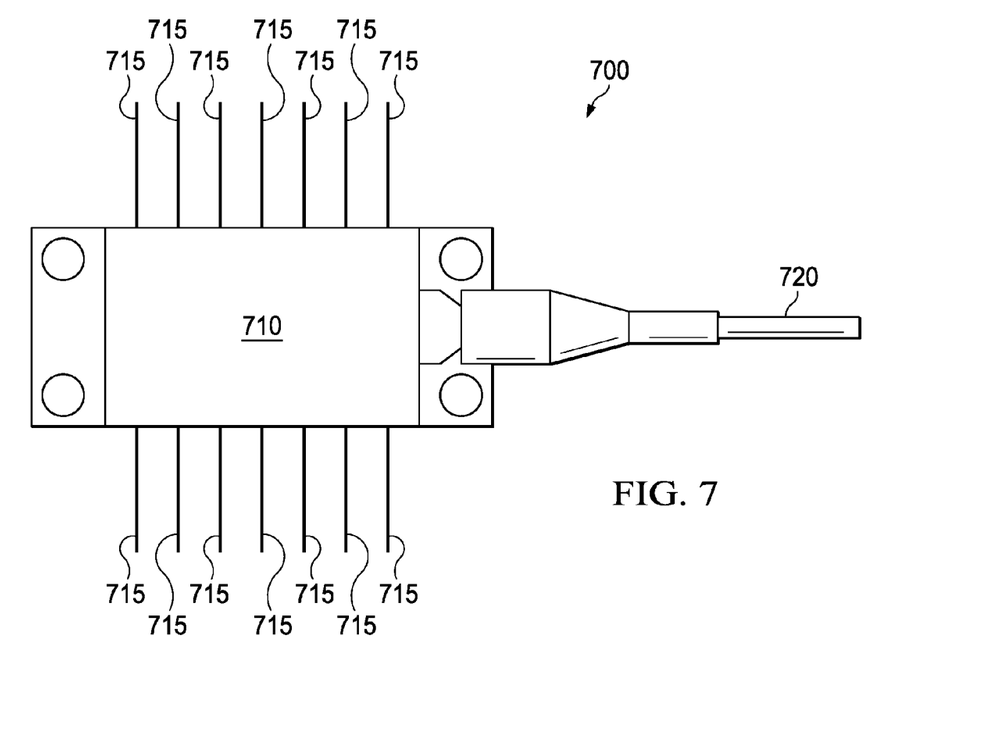
FIG. 7 shows an embodiment of a laser diode in a butterfly package.

FIG. 7 shows a package 700 according to an embodiment of the invention. A laser diode is disposed on a carrier and encapsulated with an encapsulation body 710. The package 700 may be a butterfly package. The package 700 comprises a plurality of pins 715 on both sides of the package 700. The laser diode disposed in the package 700 is configured to emit a laser beam via the fiber 720. A more detailed description of the laser diode and the carrier may be found in the embodiments of FIGS. 2A, 2B and 4, and their related description. Alternatively, the package 700 may include an arrangement as shown in FIGS. 9B and 9C with a lens/fiber 720 instead of a window 920.

Figure 8A:
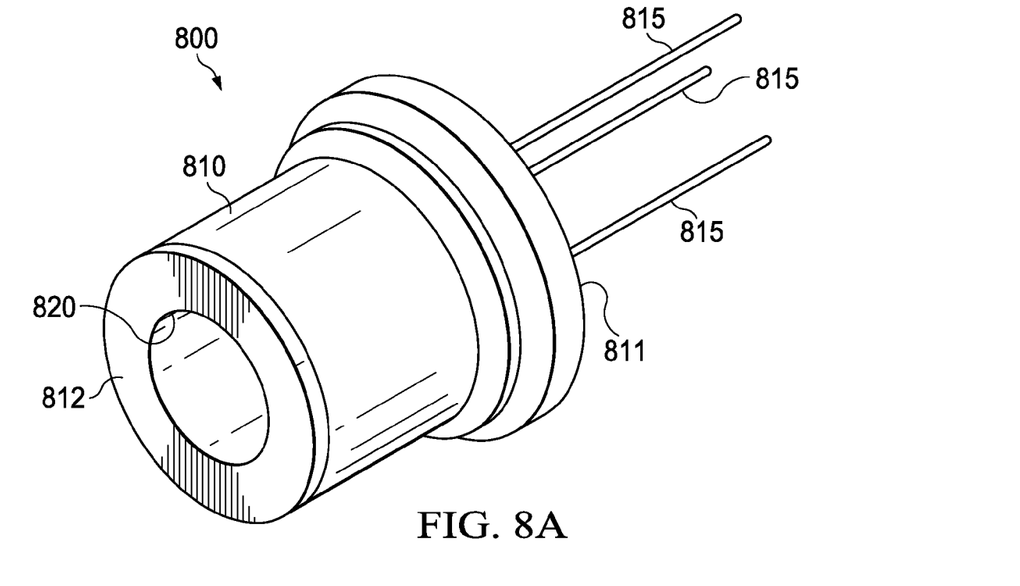
FIGS. 8A and 8B show an embodiment of a laser diode in a 9 mm package.
Figure 8B:
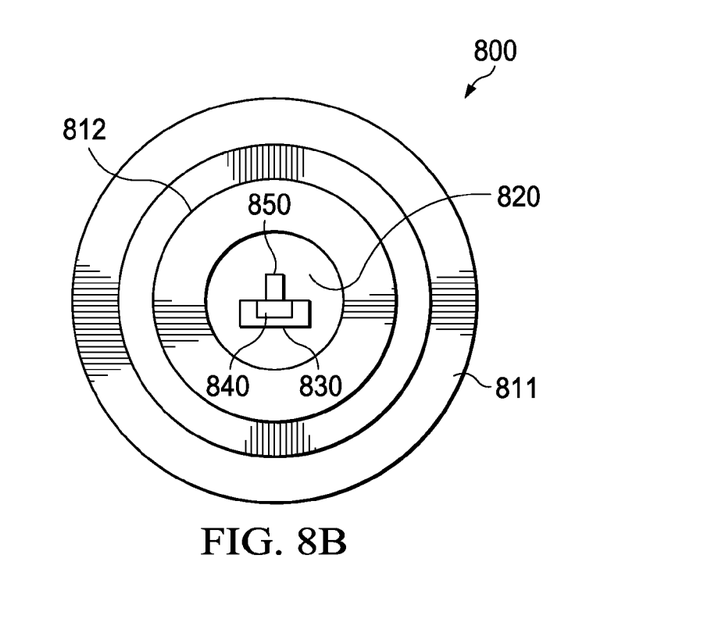

FIGS. 8A and 8B show a package 800 according to an embodiment of the invention. A laser diode 850 is disposed in an encapsulation body 810. The encapsulation body 810 comprises a plurality of pins 815 (e.g., three pins, case, cathode, and anode) on a bottom surface 811 and a cavity or opening 820 on the top surface 812. The laser diode disposed on the carrier 830 is located in encapsulation body 810 such that the laser beam leaves the package 800 through the opening 820. The mount 830 may comprise a first surface on which the gain region of the laser diode 850 is mounted and a second surface, spaced from the first surface, over which the wavelength selection region or resonator region (e.g., DBR grating region) of the laser diode 850 is disposed (e.g., thermally floating). For example, the gain region of the laser diode 850 is mounted on the surface of the mount 830 and the wavelength selection region of the laser diode 850 is disposed over and spaced apart from a trench bottom surface of a trench 840. In some embodiments the laser diode 850 comprises one wavelength selection region and a trench is disposed under the wavelength selection region. In alternative embodiments the laser diode 850 comprises two wavelength selection regions and two trenches are disposed underneath these two wavelength selection regions respectively. In yet another embodiment, the laser diode 850 is longer than the width of the mount 830 so that the (two) wavelength selection region(s) may extend beyond a sidewall(s) of the mount 830. The laser diode 850 may be a DBR laser and the mount 830 may be the carrier as described in the embodiments of FIGS. 2A, 2B and 4, and their related description. A more detailed description of the laser diode 850 and the carrier 830 may be found in previous embodiments.

Figure 9A:
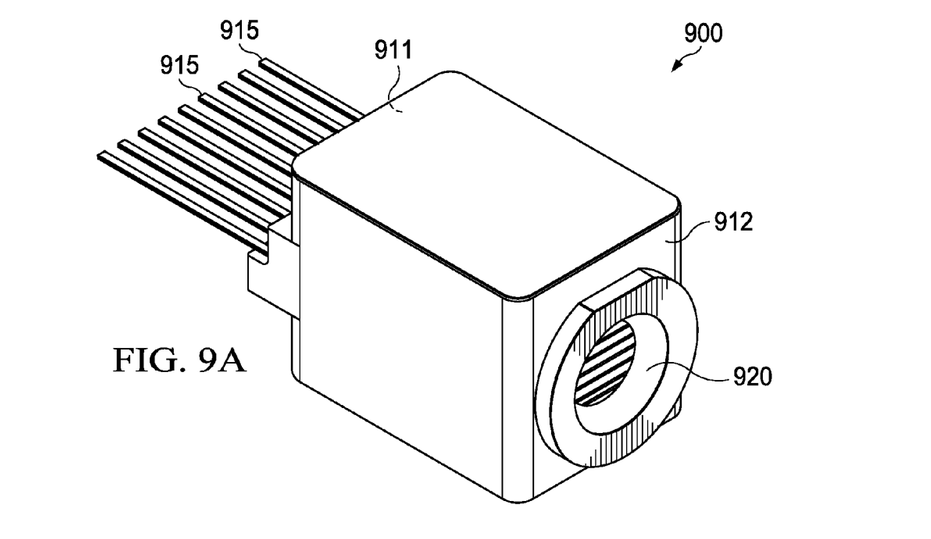
FIGS. 9A-9C show an embodiment of a laser diode in a TOSA package.
Figure 9B:
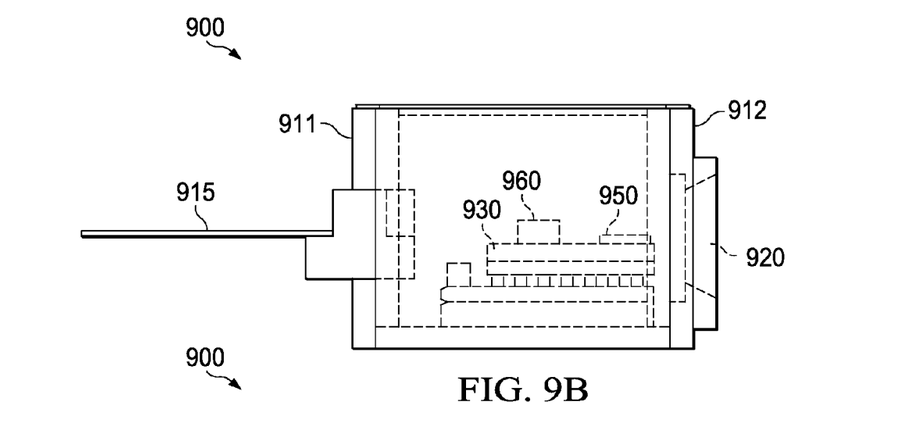
Figure 9C:
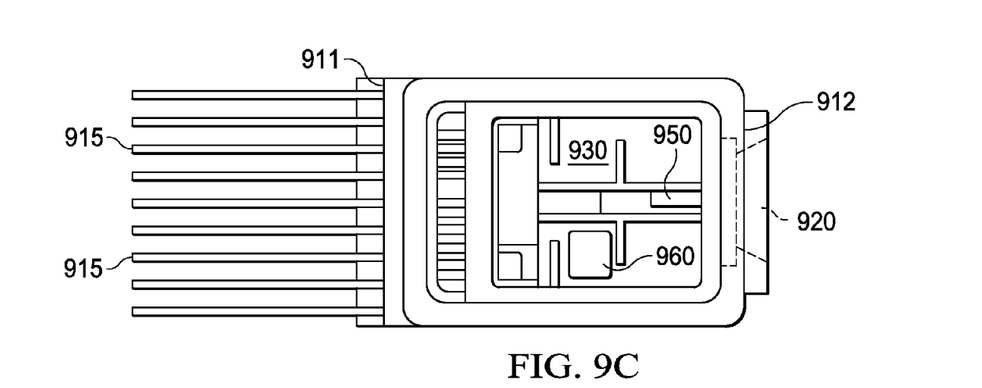

FIGS. 9A-9C show a package 900 according to an embodiment of the invention. A laser diode 950 is disposed in an encapsulation body 910. The encapsulation body 910 comprises a plurality of pins 915 on a first side surface 911 and a cavity or opening 920 on a second side surface 912. The laser diode 950 disposed on a carrier 930 is located in encapsulation body 910 such that the laser beam leaves the package 900 through the opening 920. The mount 930 may comprise a first surface on which the gain region of the laser diode 950 is mounted and a second surface, spaced from the first surface, over which the wavelength selection region or resonator region (e.g., DBR grating region) of the laser diode 950 is disposed (e.g., thermally floating). For example, the gain region of the laser diode 950 is mounted on the surface of the mount 930 and the wavelength selection region of the laser diode 950 is disposed over and spaced apart from a trench bottom surface of a trench 940. In some embodiments the laser diode 950 comprises one wavelength selection region. In alternative embodiments the laser diode 950 comprises two wavelength selection regions and two trenches are disposed underneath these two wavelength selection regions respectively. In yet another embodiment, the laser diode 950 is longer than and overhangs the mount 930 so that the (two) wavelength selection region(s) may extend beyond a sidewall(s) of the mount 930. The laser diode 950 may be a DBR laser diode and the mount 930 may be the carrier as described in the embodiments of FIGS. 2A, 2B and 4, and their related description. In some embodiments a thermistor 960 is mounted on the mount on surface 217. A more detailed description of the laser diode 950 and the carrier 930 may be found in previous embodiments.

Figure 10:
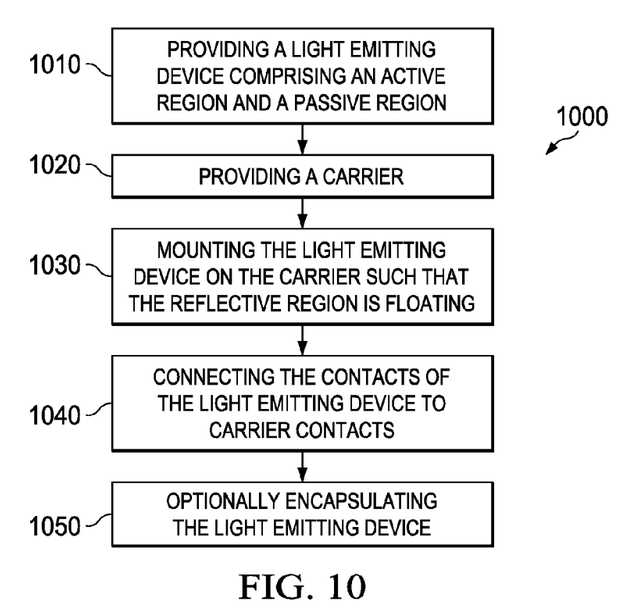
FIG. 10 shows an embodiment of a method for manufacturing a DBR laser module.

FIG. 10 shows a method 1000 to manufacture a module or package according to an embodiment of the invention. At step 1010 a light emitting device such as a laser diode is provided. The laser diode may be a DBR laser or a semiconductor laser. The laser diode comprises a gain region (active region) and a wavelength selection or resonator region (e.g., DBR grating region). Alternatively, the laser diode comprises a gain region and a plurality of wavelength selection regions, e.g., two DBR grating regions.

At step 1020 a carrier is provided. The carrier may comprise a material with a CTE that is similar to the CTE of the laser diode. Alternatively, the carrier may comprise a material with a CTE different to the CTE of the laser diode. The carrier may be electrically insulating but thermally conducting. For example, the carrier may be a submount comprising AlN or CuW. The carrier may comprise contacts on a top surface of the carrier. Alternatively, the carrier may be electrically and thermally conducting (e.g., a heat sink). For example, the carrier may comprise copper or tungsten. In some embodiments the carrier may comprise a groove, a trench or a recess. In some embodiments, the carrier may comprise more than one trench (e.g., two trenches). The grooves may be disposed parallel to each other in carrier. The carrier with trenches may be formed in a molding process. Alternatively, the trenches may be formed by mechanically removing material from the carrier or etching material from the carrier.

At step 1030 the laser is mounted on the carrier such that the wavelength selection region (DBR grating region) is thermally floating. Only the gain region of the laser is electrically and/or thermally connected to the carrier. The wavelength selective region overhangs the trench and is spaced apart from the trench bottom surface. The wavelength selection region is not electrically and/or thermally connected to the sidewalls and/or the bottom surface of the trench. An air gap may be disposed between the trench bottom surface and the surface of the wavelength selection region. Alternatively, an encapsulation material may be disposed between the trench bottom surface and a bottom surface of the wavelength selection region of the laser diode. Other materials such as a dielectric layer may be disposed between the trench bottom surface and the bottom surface of the wavelength selection region of the laser diode.

The laser diode may be disposed on the carrier by soldering the gain region to a first carrier contact. Alternatively, the gain region of the laser diode may be connected to a first carrier contact via adhesive (conductive) paste or an adhesive (conductive) film. In some embodiments, the gain region of the laser diode may not electrically connected to the carrier via the bottom surface of the laser diode (but, e.g., via bonds on the top surface).

In some embodiments the laser diode is disposed on the carrier such that a first wavelength selection region is thermally floating and hanging over the first trench and a second wavelength selection region is thermally floating and hanging over the second trench. In some embodiments only the first wavelength selection region is thermally floating and hanging over the first trench while the second wavelength selection region is mounted on the carrier (similar as the gain region). In yet other embodiments, the wavelength selection region(s) may extend beyond one or more sidewalls of the carrier thereby being not mounted on the carrier. In these embodiments the carrier may comprise less than two trenches (e.g., only one trench or no trench).

At step 1040 a contact(s) at the top of the laser may be electrically connected to a second carrier contact. For example, laser contacts on the top surface (e.g., anode) of the laser is electrically connected (e.g., wire bonded or clip bonded) to a second carrier contact while the bottom surface (e.g., cathode) is electrically connected (e.g., soldered) to the first contact of the carrier. Alternatively, the anode contact(s) and the cathode contact(s) of the laser are both disposed on the top surface of the laser and electrically connected to first and second carrier contacts.

At optional step 1050 the carrier and the laser diode are encapsulated. For example, the carrier and the laser diode are disposed in an encapsulation body. The encapsulation body may comprise a metal, for example. Alternatively, the carrier and the laser diode may be encapsulated with a molding material such as a thermosetting resin.

A method to operate the semiconductor lasers or laser diodes of the previous embodiments may comprise applying current ranges of 50 mA, 100 mA, 150 mA or 200 mA and thereby emitting mode hop free laser light. Other, higher drive current ranges may also be possible as explained.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
    a thermally conductive carrier; and
    an active region of an electric device, the active region configured to emit light; and
    a first wavelength selection region of the electric device monolithically attached to the active region, wherein the active region is connected to the carrier while the first wavelength selection region is not directly connected the carrier, and wherein the first wavelength selection region is configured to track a peak gain of the active region passively.

2. The device according to claim 1, wherein the electric device further comprises a second wavelength selection region, wherein the second wavelength selection region is monolithically attached to the active region, wherein the second wavelength selection region is not directly connected the carrier, and wherein the second wavelength selection region is configured to track the peak gain of the active region passively.

3. The device according to claim 1, wherein the electric device is a light emitting device, wherein the active region is a gain region, and wherein the first wavelength selection region is a DBR grating region.

4. The device according to claim 1, wherein the carrier comprises a first trench, wherein the active region is mounted on the carrier, wherein the first wavelength selection region is located over the first trench, and wherein a bottom surface of the first wavelength selection region is spaced apart from a bottom surface of the first trench.

5. The device according to claim 1, further comprising a heatsink, wherein the carrier is disposed on the heatsink, and wherein the carrier comprises a CTE between a CTE of the light emitting device and the CTE of the heatsink.

6. The device according to claim 1, further comprising an encapsulation body, encapsulating the electric device.

7. The device according to claim 1, wherein the electric device comprises a light emitting device, and wherein the light emitting device is configured to emit mode hop free light for a drive current range of about 200 mA.

8. The device according to claim 1, wherein the first wavelength selection region is configured to track a thermally induced change from the active region within 15 ms.

9. The device according to claim 1, wherein the active region is connected to a first carrier surface, and wherein the first wavelength selection region is not connected to a second carrier surface directly adjacent to the first carrier surface.

10. The device according to claim 9, further comprising a second wavelength selection region, wherein the second wavelength selection region is disposed over a third carrier surface, wherein the third carrier surface is directly adjacent to the first carrier surface, and wherein a bottom surface of the second wavelength selection region is spaced apart from the third carrier surface.

11. The device according to claim 1, wherein the first wavelength selection region is thermally floating with respect to the active region.

12. A device comprising:
    a thermally conductive carrier; and
    an electric device disposed on the carrier such that an active region is connected to the carrier while a first wavelength selection region is spaced apart from the carrier,
    wherein the active region is configured to emit light,
    wherein the first wavelength selection region is monolithically attached to the active region, and
    wherein the first wavelength selection region is configured to passively change a reflectivity and to track a thermally induced change in a wavelength of the active region.

13. The device according to claim 12, wherein the electric device further comprises a second wavelength selection region, wherein the second wavelength selection region is monolithically attached to the active region, wherein the second wavelength selection region is spaced apart from the carrier, and wherein the second wavelength selection region is configured to passively change the reflectivity and to track the thermally induced change in the wavelength of the active region.

14. The device according to claim 12, wherein the electric device is a light emitting device, wherein the active region is a gain region, and wherein the first wavelength selection region is a DBR grating region.

15. The device according to claim 12, wherein the carrier comprises a first trench, wherein the active region is mounted on the carrier, wherein the first wavelength selection region is located over the first trench, and wherein a bottom surface of the first wavelength selection region is spaced apart from a bottom surface of the first trench.

16. The device according to claim 12, further comprising a heatsink, wherein the carrier is disposed on the heatsink, and wherein the carrier comprises a CTE between a CTE of the light emitting device and the CTE of the heatsink.

17. The device according to claim 12, further comprising an encapsulation body, encapsulating the electric device.

18. The device according to claim 12, wherein the electric device comprises a light emitting device, and wherein the light emitting device is configured to emit mode hop free light for a drive current range of about 200 mA.

19. The device according to claim 12, wherein the first wavelength selection region is configured to track a thermally induced change from the active region within 15 ms.

20. The device according to claim 12, wherein the active region is connected to a first carrier surface, and wherein the first wavelength selection region is not connected to a second carrier surface directly adjacent to the first carrier surface.

21. The device according to claim 20, further comprising a second wavelength selection region, wherein the second wavelength selection region is disposed over a third carrier surface, wherein the third carrier surface is directly adjacent to the first carrier surface, and wherein a bottom surface of the second wavelength selection region is spaced apart from the third carrier surface.

22. The device according to claim 12, wherein the first wavelength selection region is thermally floating with respect to the active region.

* * * * *